(12) United States Patent
Lee

(10) Patent No.: US 6,845,060 B2
(45) Date of Patent: Jan. 18, 2005

(54) PROGRAM COUNTING CIRCUIT AND PROGRAM WORD LINE VOLTAGE GENERATING CIRCUIT IN FLASH MEMORY DEVICE USING THE SAME

(75) Inventor: Sang Yong Lee, Ichon-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 229 days.

(21) Appl. No.: 10/310,871

(22) Filed: Dec. 6, 2002

(65) Prior Publication Data

US 2004/0130963 A1 Jul. 8, 2004

(30) Foreign Application Priority Data

May 17, 2002 (KR) .................... 10-2002-0027480

(51) Int. Cl.⁷ ........................................... G11C 8/00
(52) U.S. Cl. ................ 365/236; 365/189.09; 365/225.7
(58) Field of Search ........................... 365/236, 189.09, 365/225.7

(56) References Cited

U.S. PATENT DOCUMENTS 6,111,789 A * 8/2000 Choi et al. ............. 365/185.22
6,552,934 B2 * 4/2003 Roohparvar ........... 365/185.18

OTHER PUBLICATIONS

Kang–Deog Suh, et al.; A 3.3V 32Mb NAND Flash Memory with Incremental Step Pulse Programming Scheme; ISSCC95 / Session7 / Flash Memory / Paper TA 7.5; 1995 IEEE International Solid–State Circuits Conference; 1995; pp. 128–129.

* cited by examiner

*Primary Examiner*—Michael S. Lebentritt
*Assistant Examiner*—Toan Le
(74) *Attorney, Agent, or Firm*—Piper Rudnick LLP (57) ABSTRACT

The present invention relates to a program counting circuit and a program word line voltage generating circuit in a flash memory device. The program counting circuit includes a data transmit unit having a plurality of fuses for receiving and transferring data, a counting reset unit for generating a reset signal in order to set the data transferred from the data transmit unit to an initial counting value, and a counting unit for setting the data to the initial counting value depending on the reset signal and sequentially performing a counting operation from the initial counting value set depending on the clock signal. Thus, the circuit can be simply implemented, and the number pf the program and verify operation can be controlled.

18 Claims, 8 Drawing Sheets

PROGRAM COUNTING CIRCUIT AND PROGRAM WORD LINE VOLTAGE GENERATING CIRCUIT IN FLASH MEMORY DEVICE USING THE SAME

BACKGROUND OF THE INVENTION

1. Field of the Invention

The invention relates generally to a program counting circuit and a program word line voltage generating circuit in a flash memory device using the same. More particularly, the invention relates to a program counting circuit for generating a step pulse necessary in an increment step pulse program (ISPP) used in a NAND type flash memory device.

2. Description of the Prior Art

In nonvolatile semiconductor memory devices such as EEPROM (electrically erasable and programmable read only memory), flash memories, and the like, NOR type nonvolatile semiconductor memory devices in which a program operation for data is performed by injecting channel hot electrons (hereinafter called 'CHE') into a floating gate, has been widely used.

In the mentioned NOR type semiconductor nonvolatile memory devices, a high current is necessarily required upon the CHE data program. However, it is difficult to supply this current by the boosting circuit within the chip. In particular, in case that the power supply voltage is a low voltage, there is a problem that the boosting circuit is difficult to operate using a single power supply. Further, in the NOR type nonvolatile semiconductor memory devices, the data program operation can be performed for only eight memory cells at a time in a byte unit, i.e., in parallel, due to current limit. Thus, this becomes a limit in increasing the program speed.

Recently, due to limitation of the NOR type semiconductor nonvolatile memory devices, NAND type nonvolatile semiconductor memory devices (hereinafter called 'NAND type flash memory') having a high memory capacity and that can be high-integrated, in which the data program is performed by injecting the electrons into the floating gate using a Fowler-Nordheim (hereinafter called 'F-N') tunneling phenomenon, have been proposed.

The NAND type flash memory has advantages that the operating current can relatively easily generates using the boosting circuit within the chip and the memory can be operated using this single current since the current is low upon the data program. With these advantages, in the NAND type flash memory, the data program operation can be performed for the memory cells connected to a selected word line, in a page unit, i.e., in batch. The program speed can be thus increased.

In the mentioned NAND type flash memory, however, if irregularity of the program characteristic caused by process irregularity, etc. is large in the data program operation, difference in the program speed between the memory cells connected to the selected word line is increased, and the repeated number of the program and verify operations is increased. Thus, there is a problem that the program speed is reduced. In the NAND type flash memory, there exists difference in the program time of about 2 order between the memory cells within the selected word line. In a conventional mode in which program pulses of the same pulse voltage values and the same pulse time widths are simply repeatedly applied, it is required that the number of the program and verify be performed about by 100 times. In this case, time taken to switch the voltage of the program operation and the verify read operation is significantly longer than time taken to apply the program voltage. An actual program speed is thus reduced. In order to solve this program, it is required that the data program operation be performed by inhibiting the number of the program and verify operations to 10 times by maximum.

However, in the mode in which the program pulses are simply repeatedly applied, it is required that the program pulse of a little high pulse voltage be applied in order to execute the data program operation. In this case, the memory cell for which the program speed is the highest is over erased. Due to this, there is a problem that irregularity of a program threshold voltage (Vt) (hereinafter called 'threshold voltage') is increased.

In order to solve this problem, a new method of programming the NAND type flash memory by which the number of the program and verify operation can be prohibited without increasing the irregularity of the Vt, was disclosed in a document, 95 ISSCC entitled "A 3.3V 32 Mb NAND Flash Memory with Incremental Step Pulse Programming Scheme (ISPP scheme) p. 128~".

In the ISPP scheme disclosed in the above document, when the program operation is repeatedly performed, the data program operation is performed so that the difference in the program voltages is gradually increased as the number of the program operation is increased, by setting a program word line voltage (i.e., high voltage applied to the selected word line) to a variable voltage value in which it is gradually increased as the number of the program operation is increased, and reference bit line voltage (i.e. voltage applied to the reference bit line) to a constant voltage value regardless of the number of the program operation.

In the data program operation by this ISPP scheme, even though the program Vt is raised as the program operation of the memory cell is performed due to increased number of the program operation, decrease in the potential of the floating gate is compensated for through the program word line voltage that is gradually increased. Thus, the electric field applied to the tunnel oxide film of the memory cell is always constantly kept.

As such, in the program operation of the ISPP scheme, it is required that the program word line voltage in which the voltage value that is step by step changed in a direction that the number of the program operation is increased, be generated. For this, a program word line voltage generating circuit is required. This circuit includes a program counting circuit.

In the conventional program counting circuit, data (i.e., power supply voltage or ground voltage) for setting an initial counting value of a flip-flop is not received from the outside, or data is received through a plurality of transistors if the data is received from the outside. Accordingly, it is difficult to control the number of the program and verify operations using the conventional program counting circuit. Even though control the number of the program and verify operations is controlled, several bus lines and the plurality of the transistors are required. Thus, there is a problem that the entire structure of the program word line voltage generating circuit is complicated.

SUMMARY OF THE INVENTION

The present invention is contrived to solve the above problems and an object of the present invention is to provide a program counting circuit capable of controlling the number of the program and verify operations, if necessary, which can be simply implemented.

Further, another object of the present invention is to provide a program word line voltage generating circuit in a flash memory device that can control a program time of each of chips by differentiating program voltages depending on the characteristics of the chips using the program counting circuit.

In order to accomplish the above object, the program counting circuit according to the present invention, is characterized in that it comprises a data transmit unit having a plurality of fuses for receiving and transferring data, a counting reset unit for generating a reset signal in order to set the data transferred from the data transmit unit to an initial counting value, and a counting unit for setting the data to the initial counting value depending on the reset signal and sequentially performing a counting operation from the initial counting value set depending on the clock signal.

The present invention provides the program word line voltage generating circuit comprises the program counting circuit, a decoding circuit unit for decoding an output signal of the program counting circuit unit, and a high-voltage generating circuit unit for generating a high voltage depending on the output signal of the decoding circuit unit.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 1:
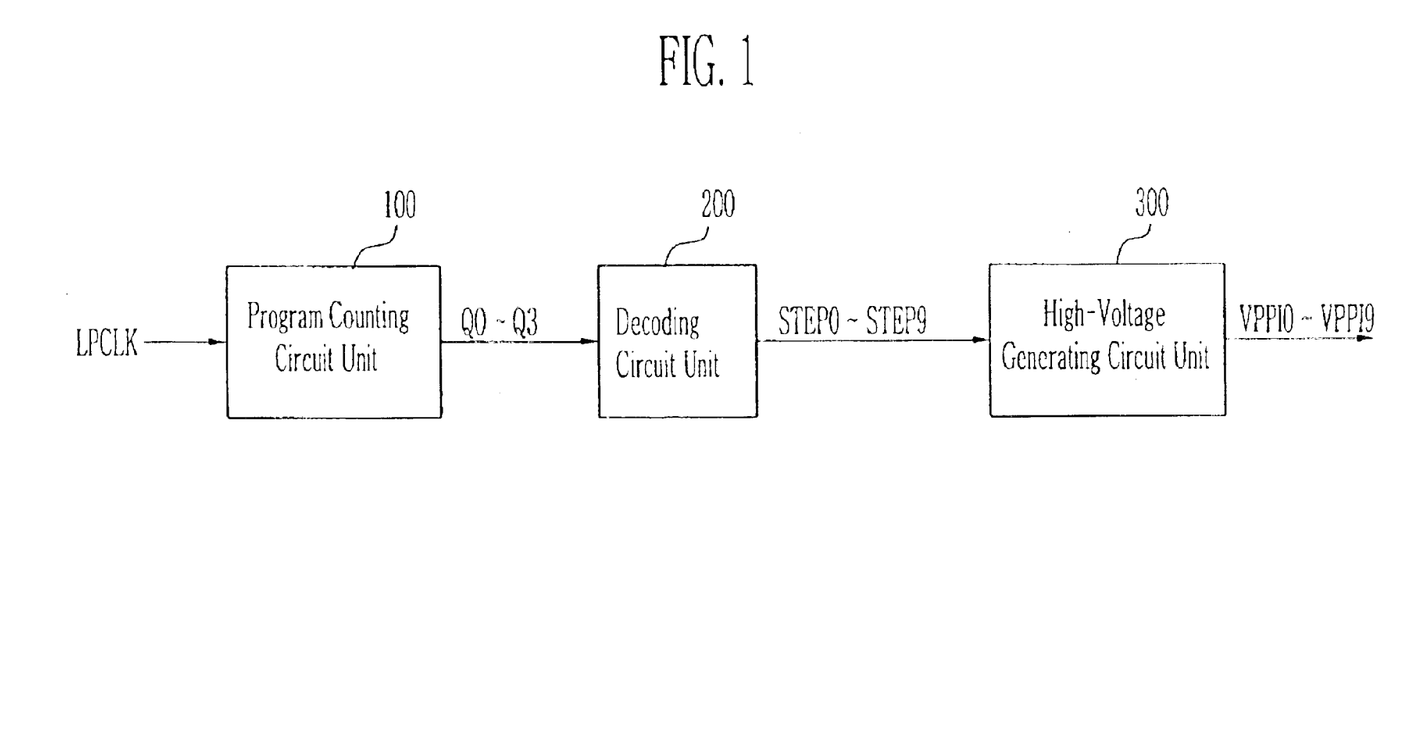
FIG. 1 is a block diagram of a program word line voltage generating circuit in a flash memory device according to a preferred embodiment of the present invention.

FIG. 1 is a block diagram of a program word line voltage generating circuit in a flash memory device according to a preferred embodiment of the present invention.

Referring now to FIG. 1, the program word line voltage generating circuit includes a program counting circuit unit 100, a decoding circuit unit 200 and a high-voltage generating circuit unit 300.

The program counting circuit 100 uses an initial data externally applied to set an initial counting value in order to count in response to a clock signal (LPCLK). The decoding circuit unit 200 decodes output signals (Q0~Q3) from the program counting circuit 100. Also, the high-voltage generating circuit unit 300 generates program word line voltages (VPPI0~VPPI9) depending on output signals (STEP0~STEP9) from the decoding circuit unit 200.

The program counting circuit 100, the decoding circuit unit 200 and the high-voltage generating circuit unit 300 included in the program word line voltage generating circuit will be below described.

Figure 2:
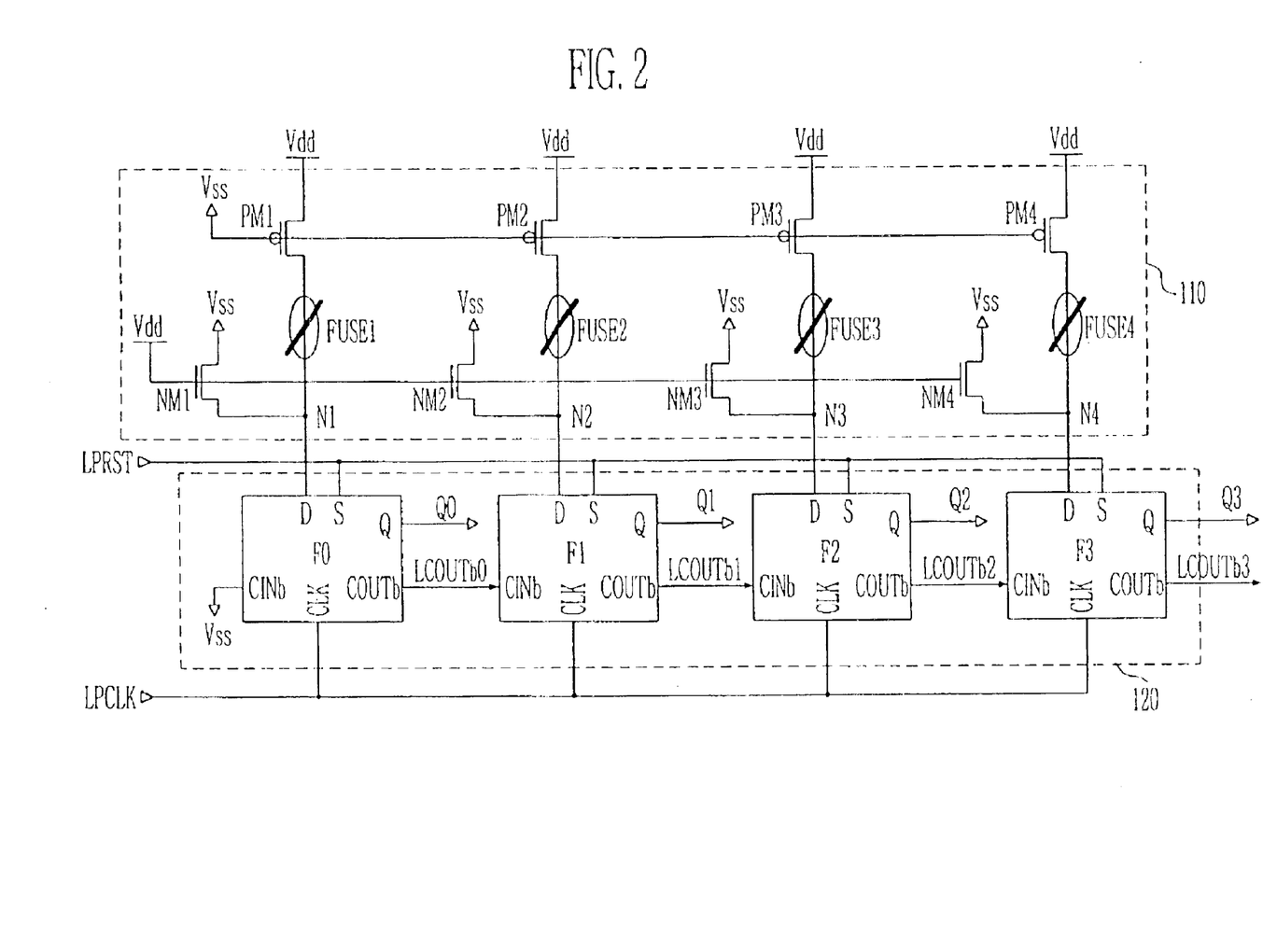
FIG. 2 is a detailed circuit diagram of the program counting circuit shown in FIG. 1.

FIG. 2 is a detailed circuit diagram of the program counting circuit 100 shown in FIG. 1. The program counting circuit 100 includes a data transmit unit 110, a counting unit 120 and a counting reset unit (not shown).

Referring to FIG. 2, the data transmit unit 110 serves to transmit an initial data externally applied, for example, a power supply voltage or a ground voltage to the counting unit 120. The data transmit unit 110 includes a plurality of PMOS transistors PM1~PM4, a plurality of NMOS transistors NM1~NM4 and a plurality of fuses FUSE1~FUSE4.

Channel length of the PMOS transistors PM1~PM4 are longer than that of the NMOS transistors NM1~NM4. The PMOS transistors PM1~PM4 are connected between the power supply terminals (Vdd) and the fuses FUSE1~FUSE4, respectively. Also, the PMOS transistors PM1~PM4 are driven by the ground voltages applied from the ground terminals (Vss) to transfer the power supply voltages to the fuses FUSE1~FUSE4.

Channel length of the NMOS transistors NM1~NM4 are shorter than that of the PMOS transistors PM1~PM4. The NMOS transistors NM1~NM4 are connected between the ground terminals (Vss) and nodes N1~N4, respectively. Also, the NMOS transistors NM1~NM4 are driven by the power supply voltages applied from the power supply terminals (Vdd) to transfer the ground voltages to the nodes N1~N4.

The fuses FUSE1~FUSE4 are connected between the PMOS transistors PM1~PM4 and the nodes N1~N4, respectively. The fuses FUSE1~FUSE4 transfer the power supply voltages transferred through the PMOS transistors PM1~PM4 to the nodes N1~N4. For example, the fuses FUSE1~FUSE4 may be implemented using poly line formed when the semiconductor memory is fabricated.

In concrete, the switching mode using the fuse is a mode used upon laser repair in the semiconductor devices. After the poly line is formed when the semiconductor devices are fabricated, a passivation layer is formed over the poly line and a portion of the passivation layer is then etched by means of an etch process so that the poly line exposed. The poly line is cut using a laser and is used if necessary (i.e., in OFF).

The counting unit 120 includes a plurality of flip-flops F1~F3. The flip-flops F0~F3 set the power supply voltage or the ground voltage transferred from the data transmit unit 110, to the initial counting value, based on the reset signal (LPRST), depending on the cutting state (ON/OFF) of the fuses FUSE1~FUSE4, and sequentially count from the initial counting value set thus depending on the clock signal (LPCLK).

The counting reset unit (not shown) outputs the reset signal (LPRST) for setting the initial counting values of the flip-flops F0~F3 in the counting unit 120. The reset signal (LPRST) sets the initial counting values of the flip-flops F0~F3 only when the initial counting values are HIGH (hereinafter called '1'). In other words, the reset signal (LPRST) affects the output signals (Q0~Q3) of the flip-flops F0~F3 when they are '1' and does not affect the output signals (Q0~Q3) when they are LOW (hereinafter called '0').

Figure 3:
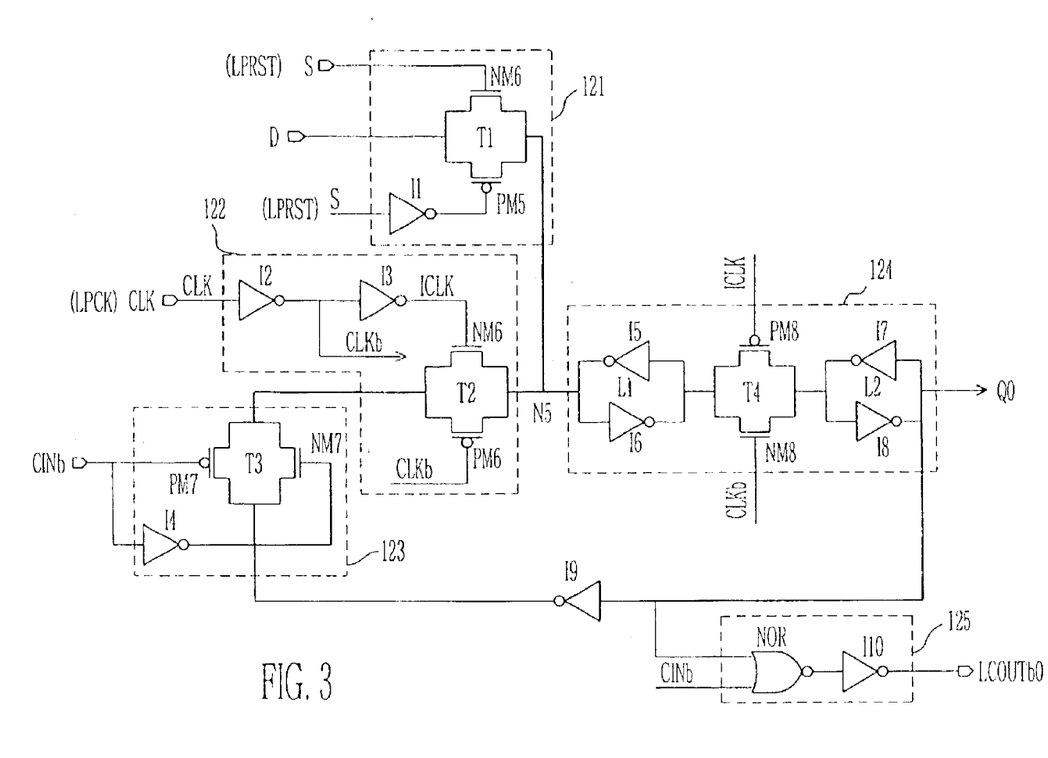
FIG. 3 is a detailed circuit diagram of the flip-flop shown in FIG. 2.

As shown in FIG. 3, each of the flip-flops F0~F3 includes a setting unit 121, first and second transmit units 122 and 123, first and second output units 124 and 125, and an inverter 19. Since the flip-flops F0~F3 have a same structure, the flip-flop F0 will be only described with reference to FIG. 3.

The setting unit 121 includes a transfer gate Ti for transferring a voltage (i.e., power supply voltage or ground voltage) of the node N1 (see FIG. 2) inputted to a terminal D, to a node N5, depending on the reset signal (LPRST) inputted to a terminal S. At this time, the transfer gate T1 has a NMOS transistor NM5 driven by the reset signal (LPRST), and a PMOS transistor PM5 driven by an output of the inverter I1.

Further, the first transmit unit 122 includes a transfer gate T2 for transferring the inverted signal of the output signal Q0 transferred through the second transmit unit 123, to the node N5, depending on the clock signal (LPCLK) inputted to a terminal CLK. At this time, the transfer gate T2 includes a NMOS transistor NM6 driven by a clock signal (ICLK) which is generated by inverting the clock signal (LPCLK) through inverters I2 and I3, and a PMOS transistor PM6 driven by a clock signal (CLKb) which is generated by inverting the clock signal (LPCLK) through the inverter I2.

The second transmit unit 123 includes a transfer gate T3 for transferring the output signal Q0 that are inverted through the inverter I9, to the first transmit unit 122, depending on the ground voltage inputted to a terminal CINb. At this time, the transfer gate T3 has a PMOS transistor PM7 driven by the ground voltage and a NMOS transistor NM7 driven by an output of the inverter I4.

Also, the first output unit 124 includes a plurality of latches L1 and L2 and a transfer gate T4 connected between the latches L1 and L2. The first output unit 124 outputs the signal transferred from the node N5 to the output Q0. The latche L1 includes two inverters I5 and I6 that are in parallel connected in opposite direction. The latch L2 includes two inverter I7 and I8 that are in parallel connected in opposite direction. At this time, the transfer gate T4 has a PMOS transistor PM8 driven by the clock signal (ICLK) of the first transmit unit 122, and a NMOS transistor NM8 driven by the clock signal (CLKb) of the first transmit unit 122. The transfer gate T4 serves to transfer the output signal of the latch L1 to the latch L2.

The second output unit 125 includes a NOR gate NOR and an inverter I10. The second output unit 125 logically combines the signal inputted to the terminal CINb and the output signal Q0 to output of output signal LCOUTb0 to the terminal CINb of the flip-flop F1 in the next stage.

In the above, the operating characteristic of the program counting circuit 100 (see FIG. 2) including the above mentioned structure will be described by reference the waveforms shown FIG. 4 and a true table 1 depending on the waveform.

TRUE TABLE 1

| LPRST | LPCLK (Order) | Q3 | Q2 | Q1 | Q0 |
|---|---|---|---|---|---|
| 1 | 0 | 1 | 1 | 1 | 1 |
| 0 | 1 | 1 | 1 | 1 | 0 |
| 0 | 2 | 1 | 1 | 0 | 1 |
| 0 | 3 | 1 | 1 | 0 | 0 |
| 0 | 4 | 1 | 0 | 1 | 1 |
| 0 | 5 | 1 | 0 | 1 | 0 |
| 0 | 6 | 1 | 0 | 0 | 1 |
| 0 | 7 | 1 | 0 | 0 | 0 |
| 0 | 8 | 0 | 1 | 1 | 1 |

TRUE TABLE 1-continued

| LPRST | LPCLK (Order) | Q3 | Q2 | Q1 | Q0 |
|---|---|---|---|---|---|
| 0 | 9 | 0 | 1 | 1 | 0 |
| 0 | 10 | 0 | 1 | 0 | 1 |
| 0 | 11 | 0 | 1 | 0 | 0 |
| 0 | 12 | 0 | 0 | 1 | 1 |
| 0 | 13 | 0 | 0 | 1 | 0 |
| 0 | 14 | 0 | 0 | 0 | 1 |
| 0 | 15 | 0 | 0 | 0 | 0 |

Figure 4:
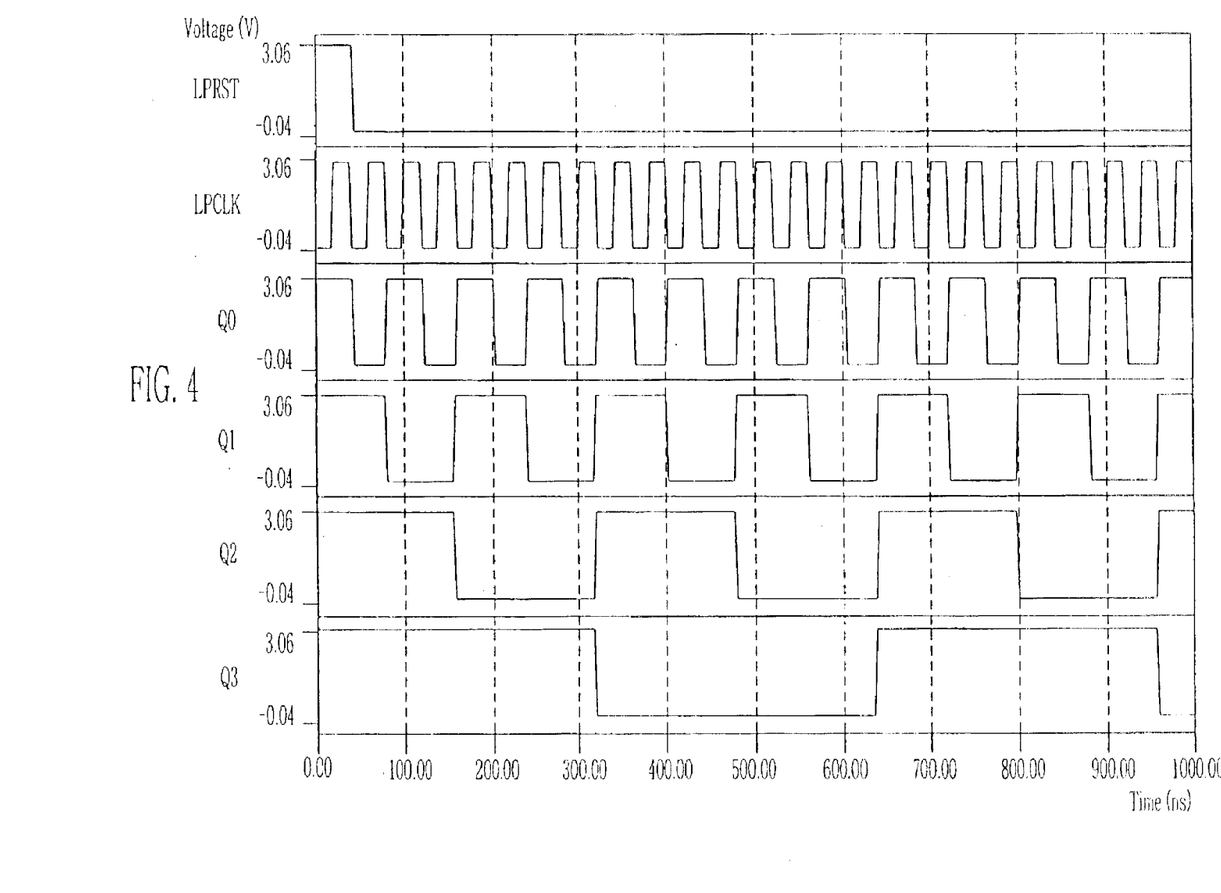
FIG. 4 and FIG. 5 are waveforms for explaining the operating characteristic of the program counting circuit shown in FIG. 2.

FIG. 4 is a waveform of the output signals (Q0~Q3) outputted to each of the flip-flops F0~F3 depending on the clock signal (LPCLK) when the fuses F1~F4 are not cut (all are in an ON state).

Referring to FIG. 4 and the true table 1, in a state that all the fuses F1~F4 are ON, the PMOS transistors PM1~PM4 of the data transmit unit 110 (see FIG. 2) are driven by the ground voltage applied from the ground terminal (Vss). The NMOS transistors NM1~NM4 are driven by the power supply voltage applied from the power supply terminal (Vdd). Thus, the power supply voltage is transferred to the terminals D of the flip-flops F0~F3 through the PMOS transistors PM1~PM4 and the fuses FUSE1~FUSE4.

The reason why this operating characteristic is obtained is that the PMOS transistors PM1~PM4 have longer channels than the NMOS transistors NM1~NM4. In other words, the NMOS transistors NM1~NM4 operate with the PMOS transistors PM1~PM4 at the same time. However, as the channels of the NMOS transistors NM1~NM4 are shorter than those of the PMOS transistors PM1~PM4, the NMOS transistors NM1~NM4 do not sufficiently pass the power supply voltage transferred through the fuses FUSE1~FUSE4 to the ground terminal (Vss). Accordingly, the power supply voltage transferred through the fuses FUSE1~FUSE4 is not all transferred to the ground terminal through the NMOS transistors NM1~NM4 but transferred to the terminal D of the flip-flops F0~F3 (see FIG. 2) through the nodes N1~N4 for some given period of time.

Meanwhile, the power supply voltage (hereinafter called 'setting signal') transferred to the terminals D of the flip-flops F0~F3 are transferred to the node N5 through the setting unit 121 (see FIG. 3) by means of the clock signal (LPCLK) and the reset signal (LPRST) of 1. The setting signal transferred to the node N5 is outputted through the first output unit 124 (see FIG. 3). Thus, the initial output signals (Q0~Q3) of the flip-flops F0~F3 are set to '1111 '.

Next, in a state that the output signal Q0~Q3 of the flip-flops F0~F3 are set to '1111', if the reset signal (LPRST) is shifted to '0', the transfer gate T1 of the setting unit 121 of each of the flip-flops F0~F3 becomes OFF. Accordingly, the setting signal of the node N1 inputted to the terminal D is no longer transferred to the node N5 and is shut down.

In this state, as in sequent 1, if the clock pulse (LPCLK) is applied to the terminal CLK of each of the flip-flops F0~F3, the output signals (Q0~Q3) of each of the flip-flops F0~F3 are inverted to a '0' state through the inverter I9 (see FIG. 3) and are then transferred to the second transmit unit 123 (see FIG. 3). At this time, in case of the flip-flop F0, the ground voltage is applied to the terminal CINb. On the contrary, in case of other flip-flops F1~F3, the output signals (LCOUTb0~LCOUTb2) outputted from the sequent 0 are applied to the terminals CINb. Accordingly, in case of the flip-flop F0, the output signal (Q0) that is inverted to the '0' state is outputted through the first transmit unit 122 and the first output unit 124 as the second transmit unit 123 is driven by means of the ground voltage. However, in case of other flip-flops F1~F3, the output signal (Q0) that is inverted to the '0' state is shut down as the second transmit unit 123 is driven. The output signal having the order 0 that is latched in the latch L2 of the first output unit 124 is outputted intact. Therefore, the output signals (Q0~Q3) of the flip-flops F0~F3 are shifted to '1110'.

As described above, the output signals (Q0~Q3) of each of the flip-flops F0~F3 are determined by the signals inputted the respective terminal CINb. For example, in case of the flip-flop F0, the output signal (Q0) is alternately shifted from '0' to '1' or from '1' to '0' every 1 pulse of the clock signal (LPCLK) depending on the ground voltage. In case of the flip-flop F1, the output signal (Q1) is alternately shifted every 2 pulses of the clock pulse (LPCLK) depending on the output signal (LCOUTbO) of the flip-flop F0. In case of the flip-flop F2, the output signal (Q2) is alternately shifted every four pulses of the clock pulse (LPCLK) depending on the output signal (LCOUTb1) of the flip-flop F1. In case of the flip-flop F3, the output signal (Q3) is alternately shifted every eight pulses of the clock pulse (LPCLK) depending on the output signal (LCOUTb2) of the flip-flop F2. Through these repetitive operations, the program counting circuit 100 sequentially performs a decrement counting until '1111', '1110', '1101', '1100', '1011', ..., '0000', shown in the true table 1.

Another example for the operating characteristic of the above program counting circuit 100 will be described by reference to the shown in FIG. 5 and a true table 2.

TRUE TABLE 2

| LPRST | LPCLK (Order) | Q3 | Q2 | Q1 | Q0 |
|---|---|---|---|---|---|
| 1 | 0 | 1 | 1 | 0 | 1 |
| 0 | 1 | 1 | 1 | 0 | 0 |
| 0 | 2 | 1 | 0 | 1 | 1 |
| 0 | 3 | 1 | 0 | 1 | 0 |
| 0 | 4 | 1 | 0 | 0 | 1 |
| 0 | 5 | 1 | 0 | 0 | 0 |
| 0 | 6 | 0 | 1 | 1 | 1 |
| 0 | 7 | 0 | 1 | 1 | 0 |
| 0 | 8 | 0 | 1 | 0 | 1 |
| 0 | 9 | 0 | 1 | 0 | 0 |
| 0 | 10 | 0 | 0 | 1 | 1 |
| 0 | 11 | 0 | 0 | 1 | 0 |
| 0 | 12 | 0 | 0 | 0 | 1 |
| 0 | 13 | 0 | 0 | 0 | 0 |
| 0 | 14 | 1 | 1 | 1 | 1 |
| 0 | 15 | 1 | 1 | 1 | 0 |

Figure 5:
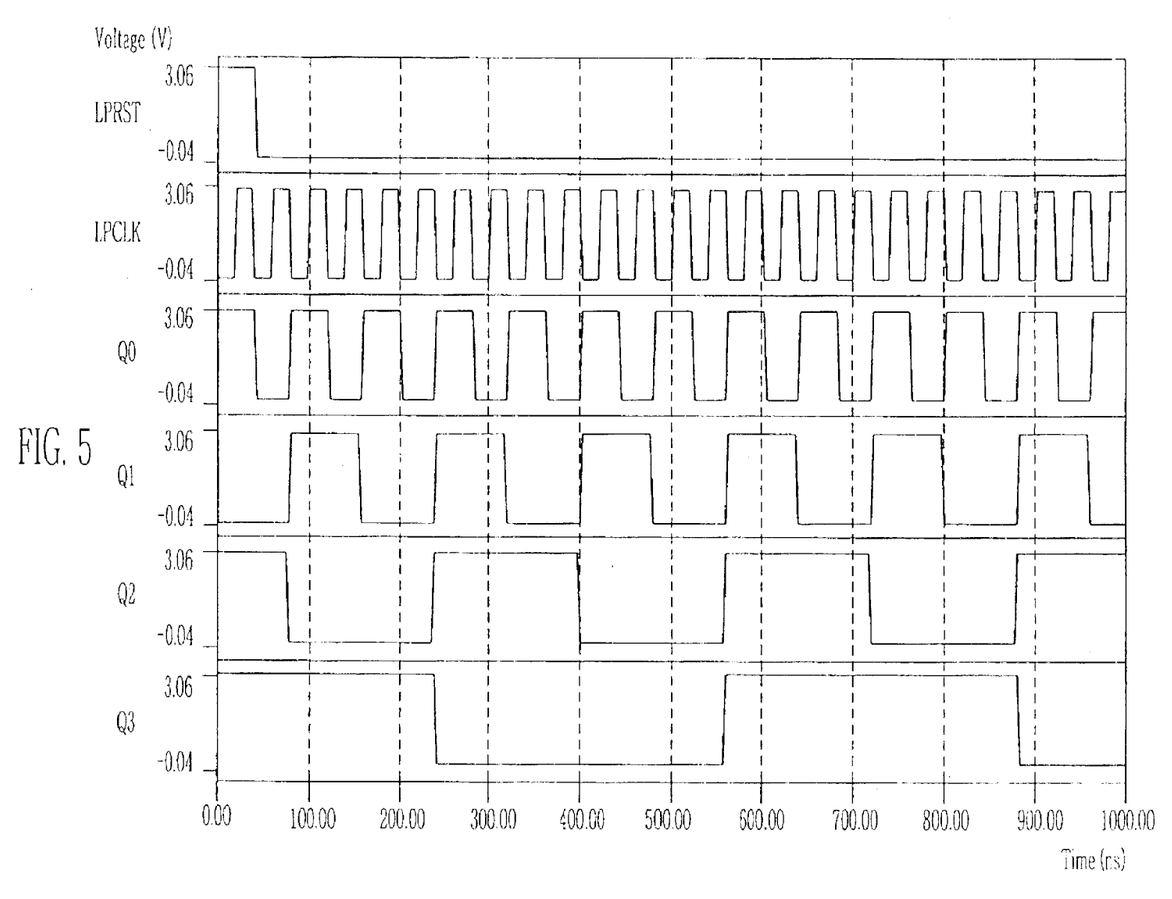

FIG. 5 is a waveform of the output signals (Q0~Q3) outputted to each of the flip-flops F0~F3 depending on the clock signal (LPCLK) when only the fuse (F2) of the fuses F1~F4 is cut (only F2 is in OFF state).

Referring not to FIG. 5 and the true table 2, in a state that all the fuses F1, F3 and F4 except for the fuse F2 of the fuses F1~F4 are in an 'ON' state, the PMOS transistors PM1~PM4 of the data transmit unit 110 (see FIG. 2) are driven by the ground voltage applied from the ground terminal (Vss). The NMOS transistors NM1~NM4 are driven by the power supply voltage applied from the power supply terminal (Vdd). Accordingly, all the power supply voltages except for the power supply voltage of the power supply voltages transferred through each of the PMOS transistors P1~P4 that uses the fuse F2 as a pass path are transferred to the counting unit 120. In other words, the power supply voltage is transferred to the terminals D of the flip-flops F0, F2 and F3 except for the flip-flop F1 and the ground voltage is applied to the terminal D of the flip-flop F1. Thus, the output signals (Q0~Q3) of the flip-flops F0~F3 that are outputted to the first output unit 124 (see FIG. 3) are set to '1101'.

As such, in the state that the output signals (Q0~Q3) of the flip-flops F0~F3 are set to '1101', if the reset signal (LPRST) is shifted to '0' and the clock signal (LPCLK) is sequentially applied, the program counting circuit unit 100 performs the decrement counting until '1101', '1100', '1011', '1010', '1001', '1000', ..., '1110', as shown in the true table 2.

The program counting circuit 100 that has been so far described by reference to FIG. 4 and FIG. 5 is constructed to set the initial counting values of the flip-flops F0~F3 depending on the state (ON/OFF) of the fuses FUSE1~FUSE4, and perform the counting operation from the initial counting value set thus. Also, the output signals (Q0~Q3) of the flip-flops F0~F3 are inputted to the decoding circuit unit 200 shown in FIG. 6.

Figure 6:
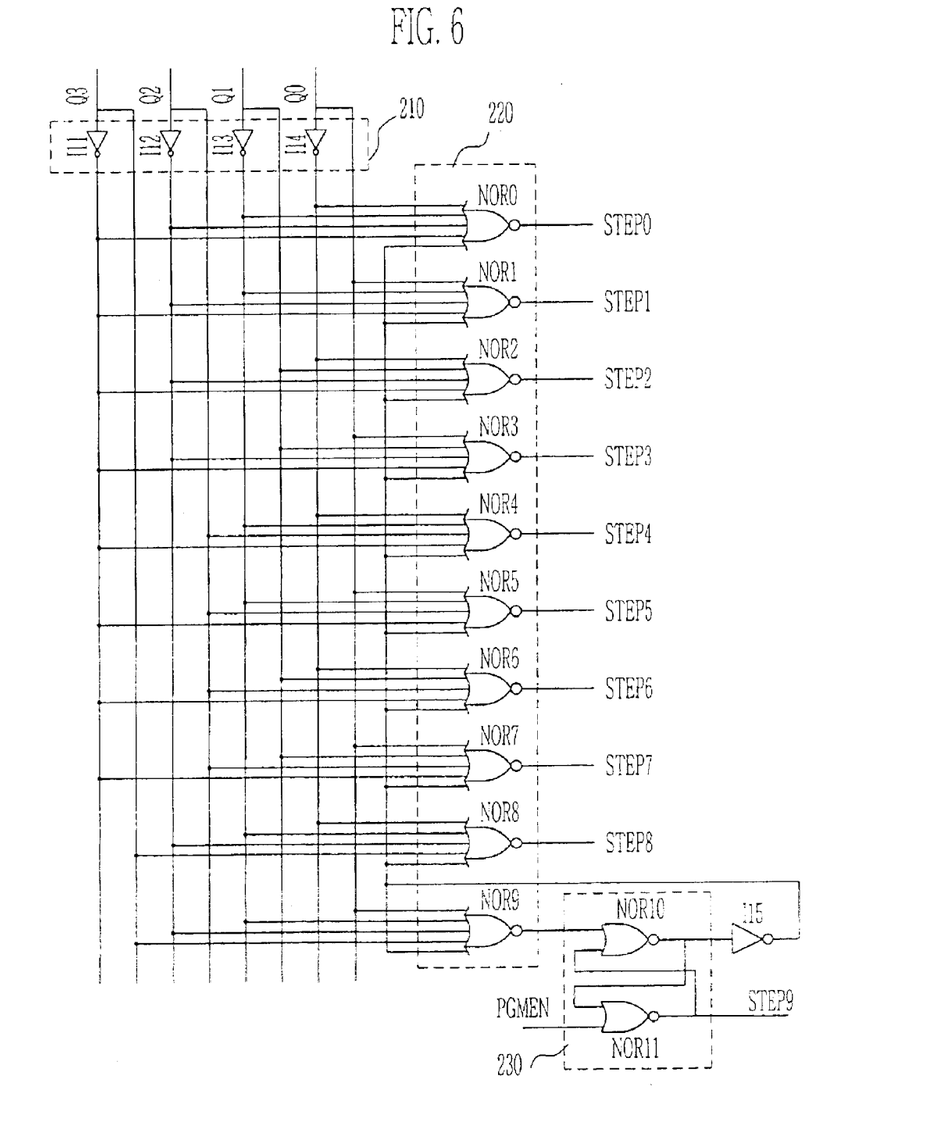
FIG. 6 is a detailed circuit diagram of the decoding circuit unit shown in FIG. 1.

Referring now to FIG. 6, the decoding circuit unit 200 includes an input inverse unit 210 having plurality of inverters I11~I14 for inverting the output signals (Q0~Q3) of each of the flip-flops F0~F3, and a decoding output unit 220 for logically combining the output signals (Q0~Q3) and output signals of the input inverse unit 210 to output decoding signals (STEP0~STEP9).

At this time, the decoding output unit 220 includes a plurality of NOR gates NOR0~NOR9 for logically combining the output signals (Q0~Q3) and the output signals of the input inverse unit 210, a flip-flop 230 for latching an output signal of the NOR gate NOR9 and a program enable signal (PGMEN), and an inverter I15 for inverting the output signal (Q) of the NOR gate NOR10 in the flip-flop 230 to transfer the inverted signal to the input terminal of each of the NOR gates NOR0~NOR9.

The flip-flop 230 has a R-S (reset-set) flip-flop structure having two NOR gates NOR10 and NOR11 for using the output signal of the NOR gate NOR9 and the program enable signal (PGMEN) as an input, respectively. The flip-flop 230 has a function that all the output signals (STEP0~STEP9) of the decoding output unit 220 are affected only by the output signals (Q0~Q3), by means of the program enable signal (PGMEN).

In other words, the flip-flop 230 outputs the output signal of '1 to the inverter I15 if the program enable signal (PGMEN) is inputted as a '1' stat. This state is kept during the time when the output signal of the NOR gate NOR9 keeps the '0' state. Meanwhile, if the output signal of the NOR gate NOR9 is shifted to a '1' state, the output signal (STEP9) of the NOR gate NOR11 is shifted to the '1' state.

The operating characteristic of the decoding circuit unit 200 mentioned will be described by reference to a true table 3 shown using the waveforms of the output signals (Q0~Q3) shown in FIG. 4 as inputs, and a true table 4 shown using the waveforms the output signals (Q0~Q3) shown in FIG. 5 as inputs.

TRUE TABLE 3

| LPCLK | Q3 | Q2 | Q1 | Q0 | STEP 9 | STEP 8 | STEP 7 | STEP 6 | STEP 5 | STEP 4 | STEP 3 | STEP 2 | STEP 1 | STEP 0 |
|---|---|---|---|---|---|---|---|---|---|---|---|---|---|---|
| 0 | 1 | 1 | 1 | 1 | 0 | 0 | 0 | 0 | 0 | 0 | 0 | 0 | 0 | 1 |
| 1 | 1 | 1 | 1 | 0 | 0 | 0 | 0 | 0 | 0 | 0 | 0 | 0 | 1 | 0 |
| 2 | 1 | 1 | 0 | 1 | 0 | 0 | 0 | 0 | 0 | 0 | 0 | 1 | 0 | 0 |
| 3 | 1 | 1 | 0 | 0 | 0 | 0 | 0 | 0 | 0 | 0 | 1 | 0 | 0 | 0 |
| 4 | 1 | 0 | 1 | 1 | 0 | 0 | 0 | 0 | 0 | 1 | 0 | 0 | 0 | 0 |
| 5 | 1 | 0 | 1 | 0 | 0 | 0 | 0 | 0 | 1 | 0 | 0 | 0 | 0 | 0 |
| 6 | 1 | 0 | 0 | 1 | 0 | 0 | 0 | 1 | 0 | 0 | 0 | 0 | 0 | 0 |
| 7 | 1 | 0 | 0 | 0 | 0 | 0 | 1 | 0 | 0 | 0 | 0 | 0 | 0 | 0 |
| 8 | 0 | 1 | 1 | 1 | 0 | 1 | 0 | 0 | 0 | 0 | 0 | 0 | 0 | 0 |
| 9 | 0 | 1 | 1 | 0 | 1 | 0 | 0 | 0 | 0 | 0 | 0 | 0 | 0 | 0 |
| 10 | 0 | 1 | 0 | 1 | 0 | 0 | 0 | 0 | 0 | 0 | 0 | 0 | 0 | 0 |
| 11 | 0 | 1 | 0 | 0 | 0 | 0 | 0 | 0 | 0 | 0 | 0 | 0 | 0 | 0 |
| 12 | 0 | 0 | 1 | 1 | 0 | 0 | 0 | 0 | 0 | 0 | 0 | 0 | 0 | 0 |
| 13 | 0 | 0 | 1 | 0 | 0 | 0 | 0 | 0 | 0 | 0 | 0 | 0 | 0 | 0 |
| 14 | 0 | 0 | 0 | 1 | 0 | 0 | 0 | 0 | 0 | 0 | 0 | 0 | 0 | 0 |
| 15 | 0 | 0 | 0 | 0 | 0 | 0 | 0 | 0 | 0 | 0 | 0 | 0 | 0 | 0 |

TRUE TABLE 4

| LPCLK | Q3 | Q2 | Q1 | Q0 | STEP 9 | STEP 8 | STEP 7 | STEP 6 | STEP 5 | STEP 4 | STEP 3 | STEP 2 | STEP 1 | STEP 0 |
|---|---|---|---|---|---|---|---|---|---|---|---|---|---|---|
| 0 | 1 | 1 | 0 | 1 | 0 | 0 | 0 | 0 | 0 | 0 | 0 | 0 | 1 | 0 |
| 1 | 1 | 1 | 0 | 0 | 0 | 0 | 0 | 0 | 0 | 0 | 0 | 1 | 0 | 0 |
| 2 | 1 | 0 | 1 | 1 | 0 | 0 | 0 | 0 | 0 | 0 | 1 | 0 | 0 | 0 |
| 3 | 1 | 0 | 1 | 0 | 0 | 0 | 0 | 0 | 0 | 1 | 0 | 0 | 0 | 0 |
| 4 | 1 | 0 | 0 | 1 | 0 | 0 | 0 | 0 | 1 | 0 | 0 | 0 | 0 | 0 |
| 5 | 1 | 0 | 0 | 0 | 0 | 0 | 0 | 1 | 0 | 0 | 0 | 0 | 0 | 0 |
| 6 | 0 | 1 | 1 | 1 | 0 | 0 | 1 | 0 | 0 | 0 | 0 | 0 | 0 | 0 |
| 7 | 0 | 1 | 1 | 0 | 0 | 1 | 0 | 0 | 0 | 0 | 0 | 0 | 0 | 0 |
| 8 | 0 | 1 | 0 | 1 | 1 | 0 | 0 | 0 | 0 | 0 | 0 | 0 | 0 | 0 |
| 9 | 0 | 1 | 0 | 0 | 0 | 0 | 0 | 0 | 0 | 0 | 0 | 0 | 0 | 0 |
| 10 | 0 | 0 | 1 | 1 | 0 | 0 | 0 | 0 | 0 | 0 | 0 | 0 | 0 | 0 |
| 11 | 0 | 0 | 1 | 0 | 0 | 0 | 0 | 0 | 0 | 0 | 0 | 0 | 0 | 0 |
| 12 | 0 | 0 | 0 | 1 | 0 | 0 | 0 | 0 | 0 | 0 | 0 | 0 | 0 | 0 |
| 13 | 0 | 0 | 0 | 0 | 0 | 0 | 0 | 0 | 0 | 0 | 0 | 0 | 0 | 0 |
| 14 | 1 | 1 | 1 | 1 | 0 | 0 | 0 | 0 | 0 | 0 | 0 | 0 | 0 | 0 |
| 15 | 1 | 1 | 1 | 0 | 0 | 0 | 0 | 0 | 0 | 0 | 0 | 0 | 0 | 0 |

Referring the true tables 3 and 4, when the initial counting values of the output signals (Q0~Q3) of each of the flip-flops F0~F3 of the counting units 120 (see FIG. 2) are '1111', the NOR gate NOR0 of the NOR gates NOR0~NOR9 in the decoding output unit 220 is first selected. The NOR gates NOR1~NOR9 are then sequentially selected by counting of the flip-flops F0~F3. Thus, the decoding output unit 220 sequentially outputs the output signals in order of STEP0, STEP1, STEP2, STEP3, . . . , STEP9.

Meanwhile, when the initial counting values of the output signals (Q0~Q3) of each of the flip-flops F0~F3 are '1101', the NOR gate NOR1 of the NOR gates NOR0~NOR9 in the decoding output unit 220 is first selected. The NOR gates NOR2~NOR9 are then sequentially selected by counting of the flip-flops F0~F3. Thus, the decoding output unit 220 sequentially outputs the output signals in order of STEP1, STEP1, STEP2, STEP3, STEP4, . . . , STEP9, STEP0.

Figure 7:
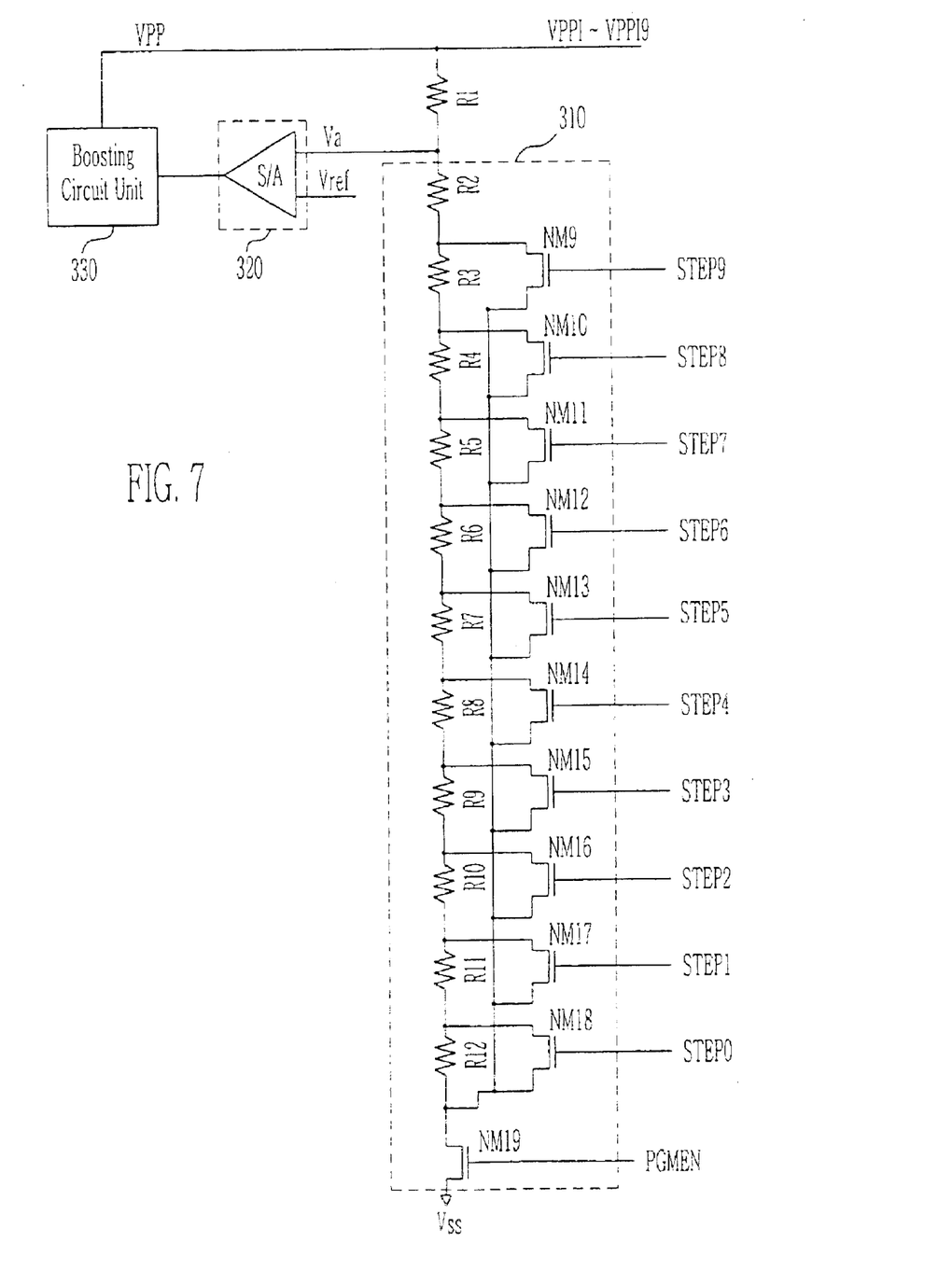
FIG. 7 is a detailed circuit diagram of the high-voltage generating circuit unit shown in FIG. 1.

As described above, the output signals (STEP0~STEP9) that are sequentially outputted through the decoding output unit 220 depending on the initial counting values of the flip-flops F0~F3 are inputted to the high-voltage generating circuit unit 300 shown in FIG. 7.

Referring not to FIG. 7, the high-voltage generating circuit unit 300 includes a voltage dividing unit 310, a voltage comparing unit 320 having a sense amplifier (S/A), a boosting circuit unit 330 and a reference voltage generator (not shown).

The voltage dividing unit 310 includes a plurality of NMOS transistors NM9~NM18 for outputting a divided voltage (Va) to the voltage comparing unit 320 depending on the output signals (STEP0~STEP9) of the decoding output unit 220 (see FIG. 6), a plurality of resistors R1~R12 and a NMOS transistor NM19 driven by the program enable signal (PGMEN).

Figure 8:
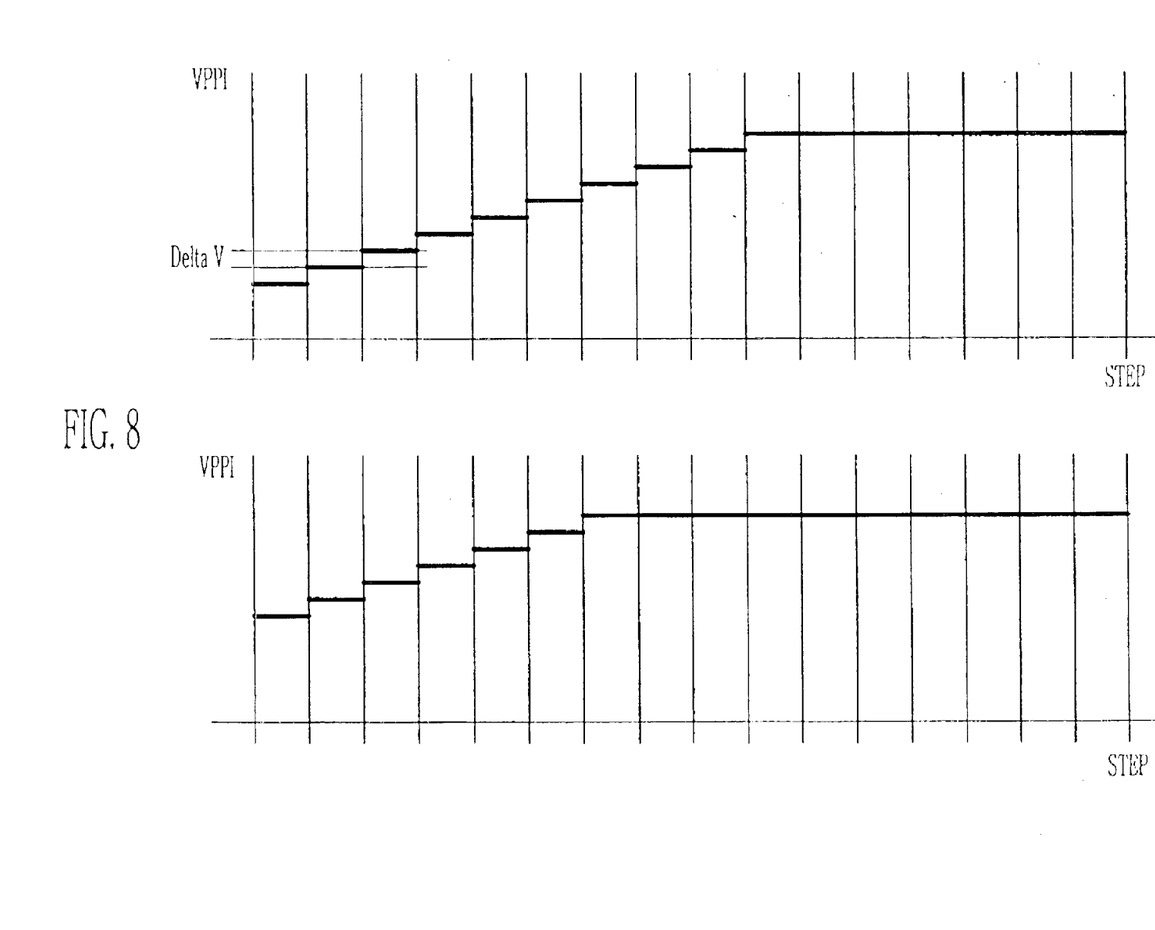
FIG. 8 is an output waveform of the high-voltage generating circuit unit shown in FIG. 7.

The resistors R1 and R2 of the resistors R1 and R12 have a relatively higher resistance values than other resistors R3~R12. The remaining resistors R3~R12 have resistance values that are sequentially higher. Therefore, as in the waveform shown in FIG. 8, the program word line voltage (VPPI) can be sequentially increased by a given potential (Delta V) in order that the output signals (STEP0~STEP9) are selected.

Drain terminals of the NMOS transistors NM9~NM18 are connected one another. Source terminals of the NMOS transistors NM9~NM8 are connected one ends of the resistors R3~R12, respectively. Thus connected NMOS transistors NM9~NM18 are driven by the output signals (STEP0~STEP9), so that the resistors R1 and R2 are serially connected to remaining resistors except for a corresponding resistor of the resistors R3~R12 (i.e., resistor connected to the source terminal of an operating NMOS transistor).

For example, in a state that the NMOS transistor NM19 is driven by the program enable signal (PGMEN), if the output signal (STEP0) of the output signals (STEP0~STEP9) is selected, the NMOS transistor NM18 is driven. Accordingly, remaining resistors R1~R11 except for the resistor R12 are serially connected, so that the divided voltage (Va) is obtained as in Equation 1.

$$Va = \{(R2 + R3 + R4 + R5 + R5 + R6 + R7 + R8 + R8 + R10 + R11)/ (R1 + (R2 + R3 + R4 + R5 + R5 + R6 + R7 + R8 + R8 + R10 + R11))\} \times VPP \quad [\text{Equation 1}]$$

Meanwhile, the voltage comparing unit 320 compares the divided voltage (Va) that is divided in the voltage dividing unit 310 and the reference voltage (Vref) outputted from the reference voltage generator. As a result of the comparison, if the divided voltage (Va) is lower than the reference voltage (Vref), the voltage comparing unit 320 boosts the divided voltage (Va) using the boosting circuit unit 330 to output a boosted high voltage (VPP). If the divided voltage (Va) is higher than the reference voltage (Vref), the voltage comparing unit 320 stops driving the boosting circuit unit 330 to output a given high voltage (VPP). As such, the program word line voltages (VPPI0~VPPI9) are sequentially increased by a given potential (Delta V), by the high voltage (VPP) in order to that the output signals (STEP0~STEP9) are selected.

As mentioned above, according to the present invention, an external data is inputted through the fuses. Therefore, the present invention has an advantageous effect that it can obtain a program counting circuit that can be simply implemented, the number of the program and verify operation can be controlled.

Further, in the present invention, the program voltages are differentiated depending on the characteristics of each of the chip using the program counting circuit. Thus, the present invention has an outstanding effect that it can control the program time of each of the chips.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A program counting circuit, comprising:
    a data transmit unit having a plurality of fuses for receiving and transferring data;
    a counting reset unit for generating a reset signal in order to set the data transferred from the data transmit unit to an initial counting value; and
    a counting unit for setting the data to the initial counting value depending on the reset signal and sequentially performing a counting operation from the initial counting value set by A clock signal.

2. The program counting circuit as claimed in claim 1, wherein the data transmit unit comprises:
    a plurality of PMOS transistors for transferring the power supply voltage to one end of each of the plurality of the fuses, respectively; and
    a plurality of NMOS transistors for transferring the ground voltage to the other end of each of the plurality of the fuses, respectively.

3. The program counting circuit as claimed in claim 2, wherein the plurality of the PMOS transistors have channels longer than those of the plurality of the NMOS transistors.

4. The program counting circuit as claimed in claim 1, wherein the data is a power supply voltage or a ground voltage.

5. The program counting circuit as claimed in claim 1, wherein the plurality of the fuses are poly lines formed when semiconductor devices are fabricated.

6. The program counting circuit as claimed in claim 1, wherein the counting unit includes a plurality of flip-flops.

7. The program counting circuit as claimed in claim 6, wherein the plurality of the flip-flops comprises:
    a setting unit for transferring the data to a node depending on the reset signal;
    a first output unit for outputting the data transferred to the node;
    an inverter for inverting an output signal of the first output unit;
    a transmit unit for transferring an output signal of the inverter to the node depending on a control signal and the clock signal; and
    a second output unit for logically combining an output signal of the first output unit and the control signal.

8. The program counting circuit as claimed in claim 7, wherein the setting unit includes a transfer gate that is driven by the reset signal to transfer the date to the node.

9. The program counting circuit as claimed in claim 7, wherein the first output unit comprises:
    a first latch for latching the data of the node;
    a transfer gate driven by the clock signal and an inverted signal of the clock signal to transfer the output signal of the first latch; and
    a second latch for latching an output signal of the transfer gate.

10. The program counting circuit as claimed in claim 7, wherein the transmit unit comprises:
    a first transfer gate driven by the control signal to transfer the output signal of the inverter; and
    a second transfer gate driven by the clock signal to transfer an output signal of the first transfer gate to the node.

11. The program counting circuit as claimed in claim 7, wherein the control signal is the ground voltage or an output signal of the second output unit of the flip-flop connected to at a front stage.

12. A program word line voltage generating circuit, comprising:
    the program counting circuit of claim 1;
    a decoding circuit unit for decoding an output signal of the program counting circuit unit; and
    a high-voltage generating circuit unit for generating a high voltage depending on the output signal of the decoding circuit unit.

13. The program word line voltage generating circuit as claimed in claim 12, wherein the decoding circuit unit comprises:
    an input inverse unit for inverting the output signal of the program counting circuit; and
    a decoding output unit for logically combining the output signal of the program counting circuit and an output signal of the input inverse unit.

14. The program word line voltage generating circuit as claimed in claim 13, wherein the decoding output unit comprises:

a plurality of NOR gates for logically combining the output signal of the program counting circuit and the output signal of the input inverse unit;

a flip-flop for latching an output signal of any one of the plurality of the NOR gates and a program enable signal; and an inverter for inverting an output signal of the flip-flop to transfer the inverted signal to input terminals of the plurality of the NOR gates.

15. The program word line voltage generating circuit as claimed in claim 14, wherein the flip-flop is a R-S flip-flop.

16. The program word line voltage generating circuit as claimed in claim 12, wherein the high-voltage generating circuit unit comprises:

a voltage dividing unit for dividing a voltage depending on the output signal of the decoding circuit unit;

a reference voltage generator for generating a reference voltage;

a voltage comparing unit for comparing a divided voltage divided through the voltage dividing unit and the reference voltage; and a boosting circuit unit for generating a high voltage depending on an output signal of the voltage comparing unit.

17. The program word line voltage generating circuit as claimed in claim 16, wherein the voltage dividing unit comprises:

a plurality of NMOS transistor driven by the output signal of the decoding circuit unit; and a plurality of resistors for dividing a voltage depending on an operating state of the NMOS transistor.

18. The program word line voltage generating circuit as claimed in claim 17, wherein the plurality of the resistors have different resistance values.

* * * * *